(12) United States Patent
Tsugawa et al.

(10) Patent No.: US 11,497,125 B2
(45) Date of Patent: Nov. 8, 2022

(54) BONDED SUBSTRATE, METAL CIRCUIT BOARD, AND CIRCUIT BOARD

(71) Applicant: DENKA COMPANY LIMITED, Tokyo (JP)

(72) Inventors: Yuta Tsugawa, Omuta (JP); Koji Nishimura, Omuta (JP); Ryota Aono, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 17/278,611

(22) PCT Filed: Sep. 27, 2019

(86) PCT No.: PCT/JP2019/038172
§ 371 (c)(1),
(2) Date: Mar. 22, 2021

(87) PCT Pub. No.: WO2020/067427
PCT Pub. Date: Apr. 2, 2020

(65) Prior Publication Data
US 2022/0039264 A1 Feb. 3, 2022

(30) Foreign Application Priority Data

Sep. 27, 2018 (JP) .............................. JP2018-181383

(51) Int. Cl.
*H05K 3/38* (2006.01)
*H05K 1/02* (2006.01)
(Continued)

(52) U.S. Cl.
CPC ............. *H05K 3/38* (2013.01); *H05K 1/0207* (2013.01); *H05K 1/0306* (2013.01); *H05K 1/181* (2013.01); *H05K 2201/10007* (2013.01)

(58) Field of Classification Search
CPC .............. H01L 23/3735; H05K 1/0207; H05K 1/0306; H05K 1/181; H05K 2201/0355;
(Continued)

(56) References Cited

U.S. PATENT DOCUMENTS 9,357,643 B2   5/2016   Yano et al.
10,515,868 B2   12/2019   Naba et al.
(Continued)

FOREIGN PATENT DOCUMENTS

JP   S64-059986 A   3/1989
JP   H10-004156 A   1/1998
(Continued)

OTHER PUBLICATIONS

Dec. 3, 2019 International Search Report issued in International Patent Application No. PCT/JP2019/038172.
(Continued)

*Primary Examiner* — William H. Mayo, III
*Assistant Examiner* — Rhadames Alonzo Miller
(74) *Attorney, Agent, or Firm* — Oliff PLC

(57) ABSTRACT

A bonded substrate includes a substrate, a metal plate forming a stacked state with the substrate, and bonding member. The metal plate has a first surface on the substrate side and a second surface opposite; wherein an edge of the first surface is located outside an edge of the second. The bonding member is disposed between the substrate and plate to bond the plate and substrate, and protrudes from the edge over an entire periphery of the plate. In cut surfaces obtained by cutting the bonded substrate, a peripheral surface length (A) from a portion corresponding to a peripheral edge of the first surface to a corresponding portion of the second, protrusion length of the bonding member, and thickness (C) of the metal plate satisfy first and second expressions.

$0.032 \leq B/(A+B) \leq 0.400$   (First Expression)

$0.5(\text{mm}) \leq C \leq 2.0(\text{mm})$   (Second Expression)

8 Claims, 10 Drawing Sheets

(51) Int. Cl.
*H05K 1/03* (2006.01)
*H05K 1/18* (2006.01)

(58) Field of Classification Search
CPC ... H05K 2201/09154; H05K 2201/098; H05K 2201/09827; H05K 2201/10007; H05K 3/38
See application file for complete search history.

(56) References Cited

U.S. PATENT DOCUMENTS

| | | | |
|---|---|---|---|
| 10,790,214 B2 | 9/2020 | Naba et al. | |
| 2004/0103808 A1* | 6/2004 | Lochun | H05K 3/1275 101/483 |
| 2004/0164730 A1* | 8/2004 | Schroeder | G01D 5/145 324/207.22 |
| 2004/0164835 A1* | 8/2004 | Shoji | H05K 1/165 336/200 |
| 2005/0174209 A1* | 8/2005 | Teshima | H01F 41/041 336/200 |
| 2006/0118905 A1* | 6/2006 | Himori | H05K 3/24 438/678 |
| 2009/0002117 A1* | 1/2009 | Kawarai | H01F 17/0006 336/233 |
| 2014/0291699 A1* | 10/2014 | Yano | H01L 29/1608 257/77 |
| 2015/0201499 A1* | 7/2015 | Shinar | H05K 1/0284 425/132 |
| 2015/0201500 A1* | 7/2015 | Shinar | H05K 3/4685 425/132 |
| 2015/0340149 A1* | 11/2015 | Lee | H01F 27/292 336/200 |
| 2016/0105969 A1* | 4/2016 | Habu | H05K 1/165 156/285 |
| 2016/0172086 A1* | 6/2016 | Habu | H01F 1/12 428/206 |
| 2016/0211061 A1* | 7/2016 | Masuda | H01F 5/00 |
| 2016/0218057 A1* | 7/2016 | Lee | H05K 1/097 |
| 2016/0343498 A1* | 11/2016 | Lee | H01G 4/248 |
| 2016/0372259 A1* | 12/2016 | Banba | H01F 27/2823 |
| 2017/0025220 A1* | 1/2017 | Nakaniwa | H01F 27/2804 |
| 2017/0135206 A1* | 5/2017 | Ueda | H05K 3/387 |
| 2018/0005918 A1 | 1/2018 | Naba et al. | |
| 2018/0054900 A1* | 2/2018 | Ueda | H05K 3/4673 |
| 2018/0091902 A1* | 3/2018 | Salvatti | H04R 7/08 |
| 2018/0366246 A1* | 12/2018 | Park | H01F 27/29 |
| 2019/0035528 A1* | 1/2019 | Choi | F16G 11/103 |
| 2019/0035535 A1* | 1/2019 | Furukawa | H01F 27/2804 |
| 2019/0051446 A1* | 2/2019 | Park | H01F 17/04 |
| 2019/0074127 A1* | 3/2019 | Ito | H04R 9/06 |
| 2019/0082542 A1* | 3/2019 | Yosui | H01F 41/043 |
| 2019/0261093 A1* | 8/2019 | Salvatti | H04R 7/08 |
| 2020/0013696 A1 | 1/2020 | Naba et al. | |

FOREIGN PATENT DOCUMENTS

| | | |
|---|---|---|
| JP | H10-326949 A | 12/1998 |
| JP | 2004-172182 A | 6/2004 |
| JP | 2004-342635 A | 12/2004 |
| JP | 2009-170930 A | 7/2009 |
| JP | 2016-174165 A | 9/2016 |
| WO | 2013/094213 A1 | 6/2013 |
| WO | 2017/056360 A1 | 4/2017 |

OTHER PUBLICATIONS

Oct. 19, 2021 Extended Search Report issued in European Patent Application No. 19867041.6.

\* cited by examiner

Fig.4

| SAMPLE NAME | (ALIAS) | PERIPHERAL SURFACE LENGTH A(mm) | PROTRUSION LENGTH B($\mu$m) | THICKNESS C(mm) | S2/S1 | INCLINATION ANGLE $\theta$(°) | B/(A+B) | OBSERVATION RESULT (PRESENCE OR ABSENCE OF PEELING) | EVALUATION RESULT |
|---|---|---|---|---|---|---|---|---|---|
| SAMPLE 1 | EXAMPLE 1 | 0.15 | 10 | 1.0 | 0.65 | 81 | 0.063 | NONE | OK |
| SAMPLE 2 | EXAMPLE 2 | 0.20 | 10 | 1.0 | 0.65 | 79 | 0.048 | NONE | OK |
| SAMPLE 3 | EXAMPLE 3 | 0.25 | 10 | 0.8 | 0.60 | 73 | 0.038 | NONE | OK |
| SAMPLE 4 | EXAMPLE 4 | 0.30 | 10 | 1.5 | 0.70 | 79 | 0.032 | NONE | OK |
| SAMPLE 5 | EXAMPLE 5 | 0.15 | 30 | 1.0 | 0.70 | 81 | 0.167 | NONE | OK |
| SAMPLE 6 | EXAMPLE 6 | 0.20 | 30 | 0.8 | 0.60 | 76 | 0.130 | NONE | OK |
| SAMPLE 7 | EXAMPLE 7 | 0.25 | 30 | 1.5 | 0.65 | 81 | 0.107 | NONE | OK |
| SAMPLE 8 | EXAMPLE 8 | 0.30 | 30 | 2.0 | 0.65 | 81 | 0.091 | NONE | OK |
| SAMPLE 9 | EXAMPLE 9 | 0.15 | 50 | 2.0 | 0.70 | 86 | 0.250 | NONE | OK |
| SAMPLE 10 | EXAMPLE 10 | 0.20 | 50 | 2.0 | 0.60 | 84 | 0.200 | NONE | OK |
| SAMPLE 11 | EXAMPLE 11 | 0.25 | 50 | 1.4 | 0.65 | 80 | 0.167 | NONE | OK |
| SAMPLE 12 | EMBODIMENT | 0.25 | 50 | 0.8 | 0.65 | 69 | 0.167 | NONE | OK |
| SAMPLE 13 | EXAMPLE 12 | 0.15 | 80 | 0.8 | 0.60 | 79 | 0.348 | NONE | OK |
| SAMPLE 14 | EXAMPLE 13 | 0.20 | 80 | 1.6 | 0.70 | 83 | 0.286 | NONE | OK |
| SAMPLE 15 | EXAMPLE 14 | 0.25 | 80 | 0.9 | 0.70 | 77 | 0.242 | NONE | OK |
| SAMPLE 16 | EXAMPLE 15 | 0.30 | 80 | 0.8 | 0.60 | 69 | 0.211 | NONE | OK |
| SAMPLE 17 | EXAMPLE 16 | 0.15 | 100 | 1.0 | 0.65 | 81 | 0.400 | NONE | OK |
| SAMPLE 18 | EXAMPLE 17 | 0.20 | 100 | 1.5 | 0.70 | 82 | 0.333 | NONE | OK |
| SAMPLE 19 | EXAMPLE 18 | 0.25 | 100 | 1.6 | 0.60 | 81 | 0.286 | NONE | OK |
| SAMPLE 20 | EXAMPLE 19 | 0.30 | 100 | 2.0 | 0.65 | 81 | 0.250 | NONE | OK |
| SAMPLE 21 | EXAMPLE 20 | 0.15 | 30 | 0.5 | 0.65 | 73 | 0.167 | NONE | OK |
| SAMPLE 22 | COMPARATIVE EXAMPLE 1 | 0.25 | 8 | 0.8 | 0.60 | 73 | 0.031 | PEELING | NG |
| SAMPLE 23 | COMPARATIVE EXAMPLE 2 | 0.30 | 5 | 1.5 | 0.70 | 79 | 0.016 | PEELING | NG |
| SAMPLE 24 | COMPARATIVE EXAMPLE 3 | 0.25 | 8 | 0.8 | 0.60 | 73 | 0.031 | PEELING | NG |
| SAMPLE 25 | COMPARATIVE EXAMPLE 4 | 0.30 | 5 | 1.5 | 0.70 | 79 | 0.016 | PEELING | NG |
| SAMPLE 26 | COMPARATIVE EXAMPLE 5 | 0.14 | 100 | 1.5 | 0.70 | 85 | 0.417 | PEELING | NG |
| SAMPLE 27 | COMPARATIVE EXAMPLE 6 | 0.15 | 105 | 1.0 | 0.65 | 81 | 0.412 | PEELING | NG |
| SAMPLE 28 | COMPARATIVE EXAMPLE 7 | 0.16 | 125 | 1.8 | 0.60 | 85 | 0.439 | PEELING | NG |

BONDED SUBSTRATE, METAL CIRCUIT BOARD, AND CIRCUIT BOARD

TECHNICAL FIELD

The present invention relates to a bonded substrate, a metal circuit board and a circuit board.

BACKGROUND ART

A circuit board as follows is known. That is, a circuit pattern is formed on a metal plate of a bonded substrate including a substrate made of ceramics and the metal plate bonded to the substrate with a bonding member such as a brazing material. Then, an electronic component is mounted on a portion of the circuit pattern (see Patent Documents 1 and 2).

In a case where such a circuit board is manufactured, the electronic component is mounted on the circuit pattern formed on the metal plate, with solder, for example. Therefore, heat is generated when the electronic component is mounted on the metal plate on which the circuit pattern is formed. In a case where such a circuit board is assembled in, for example, a portion of a product (not illustrated), and is operated, heat is generated from the electronic component. For these reasons, the bonded substrate and the circuit board are required to satisfy the heat cycle characteristics which are equal to or higher than predetermined criteria.

A semiconductor element such as so-called a power IC is used as the electronic component of such a circuit board. In recent years, the power of power ICs has been increasing. The semiconductor element such as the power IC may generate heat at a high temperature (for example, 200° C.) during an operation of a circuit board. For the above reasons, the bonded substrate and the circuit board are required to satisfy the heat cycle characteristics higher than the predetermined criteria.

Here, Patent Document 1 discloses a semiconductor device including a ceramic-copper circuit board (a ceramic substrate and a copper plate on which a circuit pattern is formed), a brazing material which is disposed between the ceramic substrate and the copper plate and bonds the ceramic substrate and the copper plate to each other, and a semiconductor chip mounted on the circuit pattern. Specifically, Patent Document 1 discloses that the protrusion length of the brazing material from the edge of the copper plate is set to be equal to or more than 10 (μm) and equal to or less than 150 (μm), the peripheral surface of the copper plate is set to an inclined surface shape, and the thickness of the copper plate is set to be equal to or more than 0.2 (mm) and equal to or less than 1.0 (mm). Patent Document 1 discloses that, in this case, when the area of the right-angled isosceles triangle of a portion corresponding to the end portion of the cross section of the copper plate is defined as an area D, and the area of a portion excluding the right-angled isosceles triangle from the end portion is defined as an area C, C/D is set to be equal to or more than 0.2 and equal to or less than 0.6 (see FIG. 3 in Patent Document 1).

Patent Document 2 discloses a circuit board that includes a ceramic substrate, a metal circuit, and a bonding layer for bonding the metal circuit to the ceramic substrate, and is for mounting an electronic component on the metal circuit. Specifically, Patent Document 2 discloses that the protrusion length of the bonding layer from the edge of the metal circuit is set to equal to or less than 30 (μm), the peripheral surface of the metal circuit is set to an inclined surface, and the thickness of the metal circuit is set to be equal to or more than 0.3 (mm) and equal to or less than 0.5 (mm).

RELATED DOCUMENT

Patent Document

[Patent Document 1] Japanese Unexamined Patent Publication No. 2016-174165

[Patent Document 2] Japanese Patent Application Laid-Open No. 10-326949

SUMMARY OF THE INVENTION

Technical Problem

Regarding the bonded substrate, the metal circuit board, and the circuit board, the thickness of the metal plate is required to increase (for example, increase to a thickness which is equal to or more than 0.5 (mm)) in order to improve heat dissipation.

In the case of the ceramic-copper circuit board disclosed in Patent Document 1, when the thickness of the copper plate is increased in a state of satisfying the above conditions regarding the range of C/D, the width of a portion having an inclined surface shape in the end portion of the copper plate increases. With such an increase, the mounting region for electronic components on the copper plate is reduced.

Further, as described above, Patent Document 2 does not disclose a case where the thickness of the metal plate is increased (for example, a case where the thickness is equal to or more than 0.8 (mm)). Therefore, Patent Document 2 does not disclose the optimum design conditions for the circuit board in consideration of the heat cycle characteristics in a case where the thickness of the metal circuit is increased.

An object of the present invention is to provide a bonded substrate having excellent heat cycle characteristics while securing a mounting region for electronic components even in a case where a metal plate has a large thickness. Another object of the present invention is to provide a metal circuit board having excellent heat cycle characteristics while securing the mounting region for the electronic components even in a case where the metal plate has a large thickness. Still another object of the present invention is to provide a circuit board having excellent heat cycle characteristics while securing the mounting region for the electronic components even in a case where the metal plate has a large thickness.

Solution to Problem

According to a first aspect of the present invention, a bonded substrate includes a substrate, a metal plate that forms a stacked state along with the substrate, has a first surface on the substrate side and a second surface on an opposite side of the first surface, and has an edge of the first surface, which is located outside an edge of the second surface when viewed in a stacking direction, and a bonding member that is disposed between the substrate and the metal plate, so as to bond the metal plate to the substrate, and protrudes from the edge over an entire periphery of the metal plate when viewed from the stacking direction. In a case where, in at least one of a plurality of cut surfaces obtained by cutting the bonded substrate along the stacking direction, a length from a portion corresponding to a peripheral edge of the first surface to a portion corresponding to a peripheral edge of the second surface in an orthogonal direction orthogonal to the stacking direction is defined as a peripheral surface length A (mm), a length of a protruding portion of the bonding member in the orthogonal direction is defined as a protrusion length B (mm), and a distance from the first surface to the second surface is defined as a thickness C (mm) of the metal plate, the following first expression and the following second expression are satisfied.

$$0.032 \leq B/(A+B) \leq 0.400 \quad \text{(First Expression)}$$

$$0.5(\text{mm}) \leq C \leq 2.0(\text{mm}) \quad \text{(Second Expression)}$$

According to a second aspect of the present invention, in the bonded substrate in the first aspect, the metal plate is a polygon having four or more corners when viewed from the stacking direction, and the at least one cut surface is a cut surface obtained by cutting the bonded substrate along a diagonal line of the metal plate when viewed from the stacking direction.

According to a third aspect of the present invention, in the bonded substrate in the second aspect, in all cut surfaces obtained by cutting the bonded substrate along all diagonal lines along the stacking direction, the peripheral surface length A (mm) and the protrusion length B (mm) satisfy the first expression.

According to a fourth aspect of the present invention, in the bonded substrate in anyone of the first to third aspects, a peripheral surface of the metal plate, which connects an entire peripheral edge of the first surface and an entire peripheral edge of the second surface is a surface including an inclined surface.

According to a fifth aspect of the present invention, in the bonded substrate in the fourth aspect, in at least one of the plurality of cut surfaces obtained by cutting the bonded substrate along the stacking direction, an inclination angle θ (°) of a portion corresponding to the inclined surface with respect to the orthogonal direction satisfies the following third expression.

$$\theta > 45(°) \quad \text{(Third Expression)}$$

According to a sixth aspect of the present invention, in the bonded substrate in the fifth aspect, in all cut surfaces obtained by cutting the bonded substrate along all diagonal lines along the stacking direction, the inclination angle θ (°) of the portion corresponding to the inclined surface with respect to the orthogonal direction satisfies the third expression.

According to a seventh aspect of the present invention, in the bonded substrate in any one of the first to sixth aspects, the peripheral surface length A (mm) is any length in a range of being equal to or more than 0.15 (mm) and equal to or less than 0.30 (mm).

According to an eighth aspect of the present invention, in the bonded substrate in any of the first to seventh aspects, the protrusion length B (mm) is any in a range of being equal to or more than $10 \times 10^{-6}$ (mm) and equal to or less than $100 \times 10^{-6}$ (mm).

According to the first aspect of the present invention, there is provided a metal circuit board in which a circuit pattern is formed on the metal plate of the bonded substrate in any one of the first to eighth aspects.

According to the first aspect of the present invention, a circuit board includes the bonded substrate in any one of the first to eighth aspects, and an electronic component mounted on the metal plate on which a circuit pattern is formed.

According to the second aspect of the present invention, in the circuit board in the first aspect, an operation tempera-ture of the electronic component is in a range of being equal to or higher than 100° C. or equal to or lower than 250° C.

Advantageous Effects of Invention

The bonded substrate in the present invention has excellent heat cycle characteristics while securing a mounting region for the electronic component even in a case where the metal plate has a large thickness.

The metal circuit board in the present invention has excellent heat cycle characteristics while securing the mounting region for the electronic component even in a case where the metal plate has a large thickness.

The circuit board in the present invention has excellent heat cycle characteristics while securing the mounting region for the electronic component even in a case where the metal plate has a large thickness.

BRIEF DESCRIPTION OF THE DRAWINGS

The above-described object, other objects, features, and advantages will be further clarified by the preferred embodiments described below and the accompanying drawings.

FIG. 4 is a table in which setting conditions and heat cycle test results in a plurality of examples and a plurality of comparative examples are collected.

DESCRIPTION OF EMBODIMENTS

<Outline>

Hereinafter, an embodiment will be described with reference to the drawings. Firstly, the configurations of a bonded substrate 10 (see FIGS. 1, 2A and 2B), a metal circuit board, and a circuit board 50 according to the embodiment will be described. Next, a method of manufacturing the circuit board 50 in the embodiment will be described. Next, a heat cycle test performed on a plurality of examples and a plurality of comparative examples will be described. Next, the effect of the embodiment will be described. Finally, modification examples will be described. In all the drawings referred to in the following description, similar components are denoted by the similar reference signs, and the description thereof will not be repeated as appropriate. The present invention is not limited to the following embodiment.

<<Configurations of Bonded Substrate, Metal Circuit Board, and Circuit Board in Embodiment>>

Figure 1:
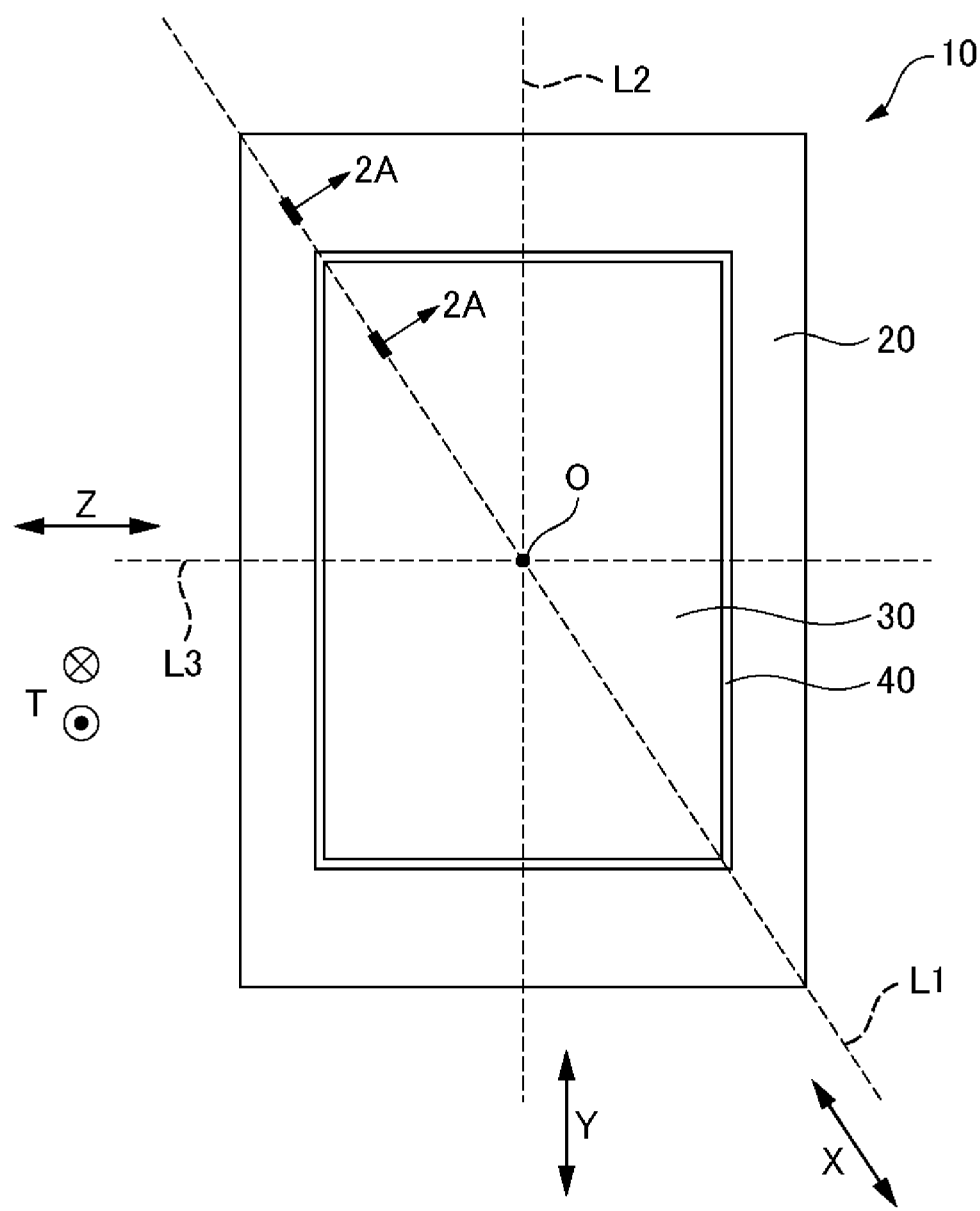
FIG. 1 is a top view of a bonded substrate according to an embodiment.
Figure 2A:
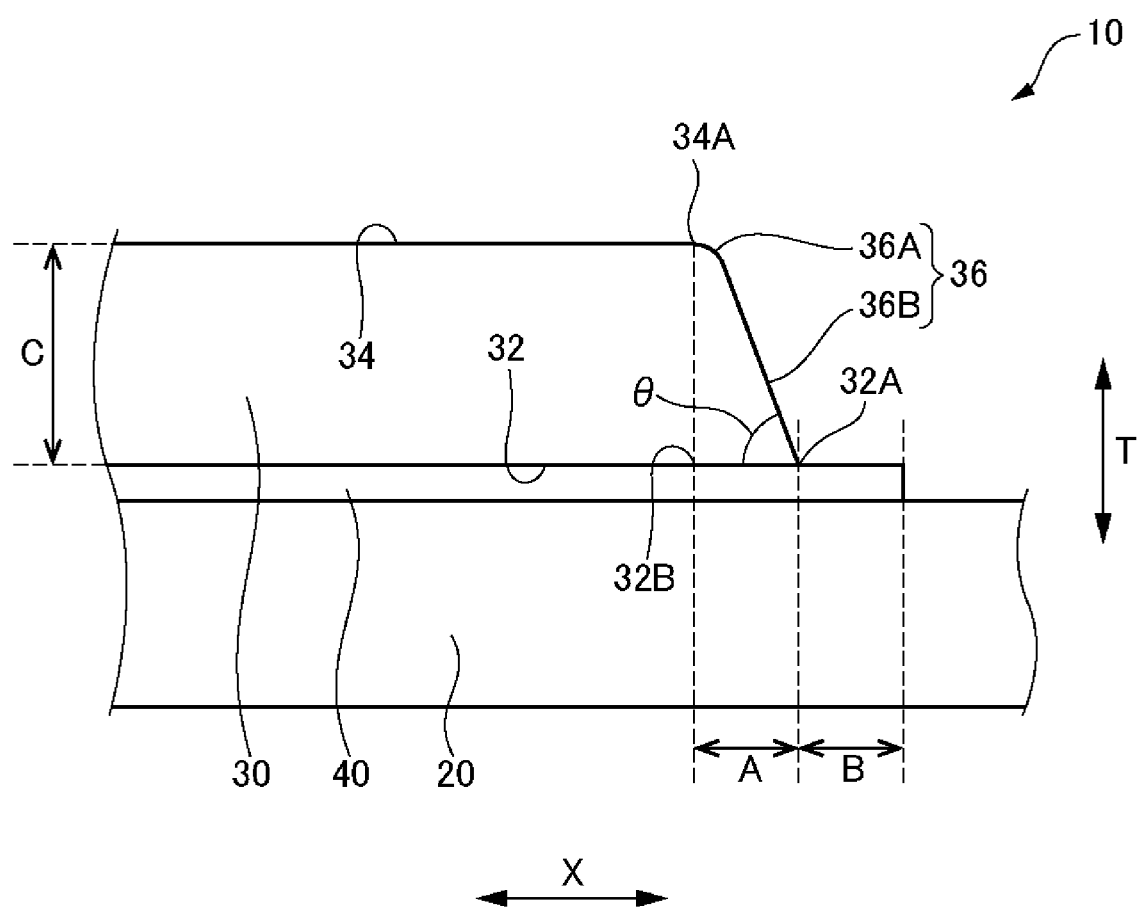
FIG. 2A is a cross-sectional view of the bonded substrate in FIG. 1, which is cut along a cutting line 2A-2A.
Figure 2B:
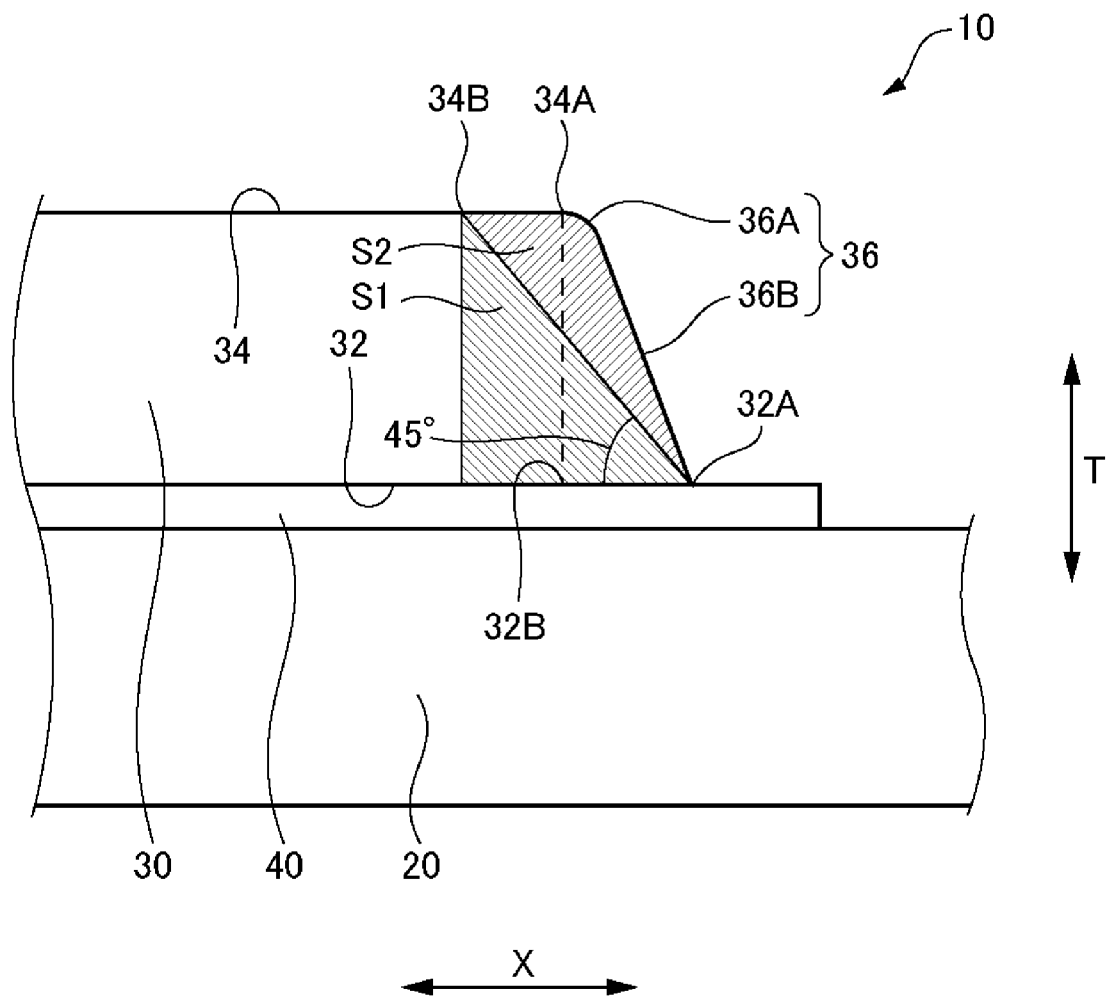
FIG. 2B is an enlarged cross-sectional view of a portion of the cross-sectional view of FIG. 2A.

FIG. 1 illustrates a top view of the bonded substrate 10 in the embodiment. FIG. 2A illustrates a cross-sectional view of the bonded substrate 10 of FIG. 1, which is cut along a cutting line 2A-2A. FIG. 2B illustrates an enlarged cross-sectional view of a portion of the cross-sectional view of the bonded substrate 10 in FIG. 2A.

<Bonded Substrate>

In the embodiment, as illustrated in FIGS. 1, 2A, and 2B, the bonded substrate 10 includes a ceramic substrate 20 (example of a substrate), a metal plate 30, and a brazing material 40 (example of a bonding member). As illustrated in FIGS. 2A and 2B, the ceramic substrate 20 and the metal plate 30 form a stacked state along with the brazing material 40 interposed between the ceramic substrate and the metal plate.

The "bonded substrate" in the embodiment, examples, and modification examples means a substrate before a circuit pattern 60 (see FIGS. 3A and 3B) is formed. The "metal circuit board" means a substrate in a state where the circuit pattern 60 is formed on the metal plate 30 of the bonded substrate 10. The "circuit board" means a board in a state where an electronic component such as a semiconductor element 70 is mounted on a portion of the circuit pattern 60 after the circuit pattern 60 is formed on the metal plate 30 of the bonded substrate 10.

(Ceramic Substrate)

In the embodiment, the ceramic substrate 20 has a function of supporting the metal plate 30. Here, as an example, the ceramic substrate 20 is made of silicon nitride, and is rectangular when viewed from a thickness direction (referring to a T direction (example of a stacking direction) in the drawings). The thickness of the ceramic substrate 20 is 0.32 (mm) as an example. The material, the shape, and the like of the ceramic substrate 20 are examples in the embodiment, and may be different from those in the embodiment as long as the ceramic substrate exhibits the above-described function. For example, the thickness may be equal to or more than 0.1 mm, and may be equal to or more than 0.2 mm. The thickness may be equal to or less than 2.5 mm, and may be equal to or less than 1.5 mm. Further, in a case of a rectangular shape (case of a rectangular or square shape), the length of one side may be equal to or more than 5 mm, and may be equal to or more than 10 mm. The length of one side may be equal to or less than 250 mm, and may be equal to or less than 200 mm.

(Metal Plate and Brazing Material)

Figure 3A:
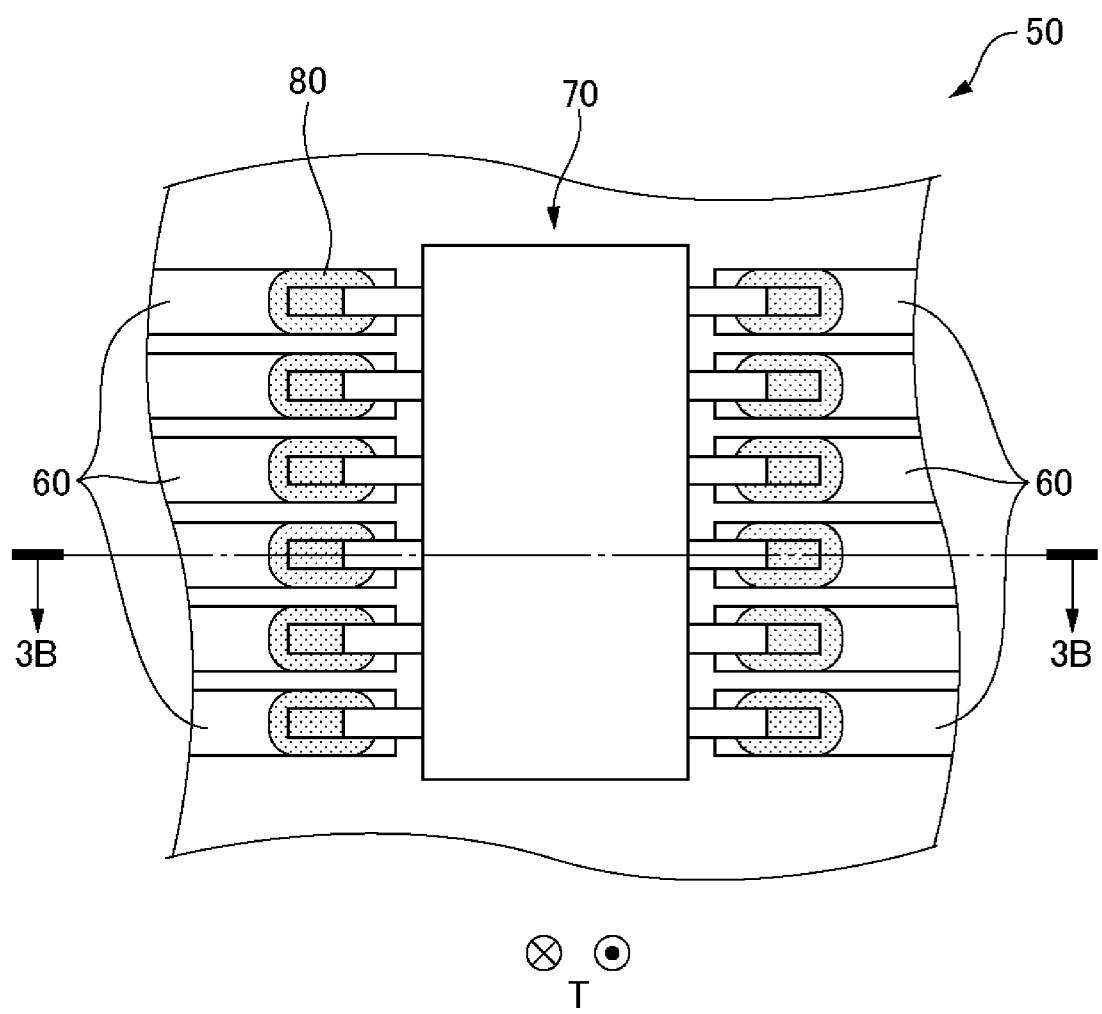
FIG. 3A is a top view of a circuit board in the embodiment, and is a partially enlarged view of amounted semiconductor element and the surroundings.
Figure 3B:
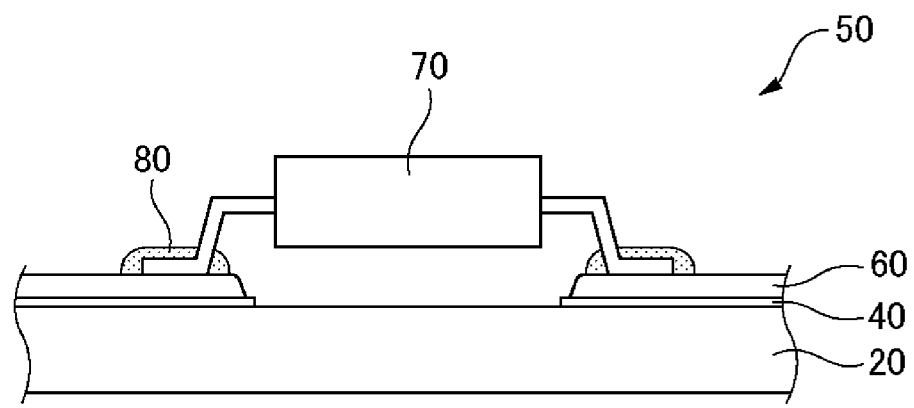
FIG. 3B is a cross-sectional view of the circuit board in FIG. 3A, which is cut along a cutting line 3B-3B.

In the embodiment, the metal plate 30 is a portion for forming the circuit pattern 60 (see FIGS. 3A and 3B). As described above, the metal plate 30 forms a stacked state along with the ceramic substrate 20.

In the embodiment, as illustrated in FIGS. 2A and 2B, the brazing material 40 is disposed between the ceramic substrate 20 and the metal plate 30, so as to bond the metal plate 30 to the ceramic substrate 20. The brazing material 40 protrudes from the entire peripheral edge of the metal plate 30 when viewed from the T direction (see FIGS. 2A and 2B). In other words, the brazing material 40 protrudes from the entire peripheral edge 32A of a lower surface 32 of the metal plate 30 when viewed from the T direction. As described above, FIGS. 2A and 2B are cross-sectional views of the bonded substrate 10 cut along the cutting line 2A-2A in FIG. 1. The cutting line 2A-2A overlaps a virtual line L1 including a diagonal line of the metal plate 30 in a case where the bonded substrate 10 is viewed from the thickness direction. When a direction along which the virtual line L1 is along is set as an X-direction, the brazing material 40 protrudes from a portion corresponding to the peripheral edge of the metal plate 30 (in other words, peripheral edge 32A of the lower surface 32) in the X-direction. The brazing material protrudes from such a portion by B (mm) as illustrated in FIG. 2A. In the present specification, the length B, that is, the length B of the protruding portion of the brazing material 40 in the X-direction (example of an orthogonal direction) orthogonal to the T direction is set as a protrusion length B. In the embodiment, the protrusion length B is $50 \times 10^{-6}$ (mm) as an example. Considering the evaluation results of the examples described later (see the table in FIG. 4), the protrusion length B is preferably equal to or more than $10 \times 10^{-6}$ (mm), and equal to or less than $100 \times 10^{-6}$ (mm).

As an example, the metal plate 30 is made of copper, and is rectangular when viewed from a thickness direction (referring to a T direction (example of a stacking direction) in the drawings). The thickness C of the metal plate 30 is 0.8 (mm) as an example. Considering the evaluation results of the examples described later (see the table in FIG. 4), the thickness C is equal to or more than 0.5 (mm) and equal to or less than 2.0 (mm). The more preferable thickness C is equal to or more than 0.8 (mm) and equal to or less than 1.2 (mm). The shape of the metal plate 30 other than the material and the thickness is an example in the embodiment, and may be different from that in the embodiment as long as the metal plate has the circuit pattern 60.

In the embodiment, among two surfaces of the metal plate 30 in the thickness direction, the flat surface on the ceramic substrate 20 side is set as the lower surface 32 (example of a first surface), and the flat surface on the opposite side of the ceramic substrate 20 side, that is, on the opposite side of the lower surface 32 is set as an upper surface 34 (example of a second surface). The surface connecting the entire peripheral edge 34A of the upper surface 34 and the entire peripheral edge 32A of the lower surface 32 of the metal plate 30 is defined as a peripheral surface 36. Here, in the metal plate 30, the edge of the lower surface 32 is located outside the edge of the upper surface 34 when viewed from the stacking direction. In other words, when the metal plate 30 is viewed from the upper side in the T direction, the lower surface 32 surrounds the upper surface 34 (see FIGS. 2A and 2B). That is, the peripheral surface 36 is an inclined surface expanding outward from the entire peripheral edge of the upper surface 34, from the upper surface 34 side to the lower surface 32 side. More specifically, as illustrated in FIG. 2B, the peripheral surface 36 is configured by a curved surface portion 36A and a flat surface portion 36B. The curved surface portion 36A is connected to the edge 34A on the outside of the edge 34A of the upper surface 34 in the X-direction (on the edge 32A side of the lower surface 32). The flat surface portion 36B corresponds to a portion from an outer end portion of the curved surface portion 36A to the edge 32A of the lower surface 32. The inclination angle θ of the flat surface portion 36B from the X-direction (lower surface 32) is steeper than 45° (inclination angle θ>45°). That is, in the embodiment, the peripheral surface 36 is a surface including the flat surface portion 36B which is an inclined surface. As an example of the inclination angle θ in the embodiment, the inclination angle θ is 69°.

As illustrated in FIG. 2, the edge 34A of the upper surface 34 as a start point of the peripheral surface 36 means a position at which a decrease in thickness starts in an observation view field of the cross section. As clear from the observation view field in FIG. 2, fine irregularities (surface roughness) on the surface are not considered in the decrease in thickness here.

Figure 2C:
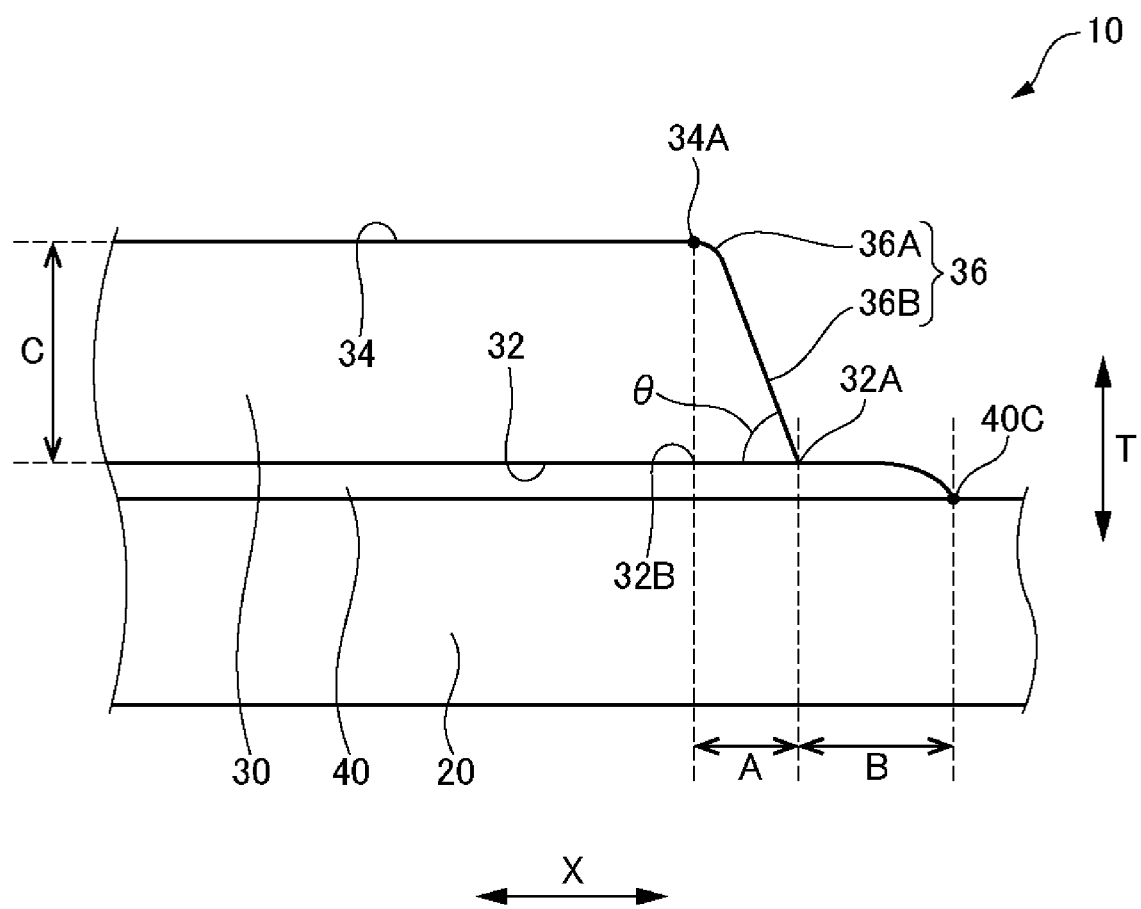
FIG. 2C is an enlarged cross-sectional view of a portion of the cross-sectional view of FIG. 2A in consideration of an example of wettability of a brazing material.
Figure 2D:
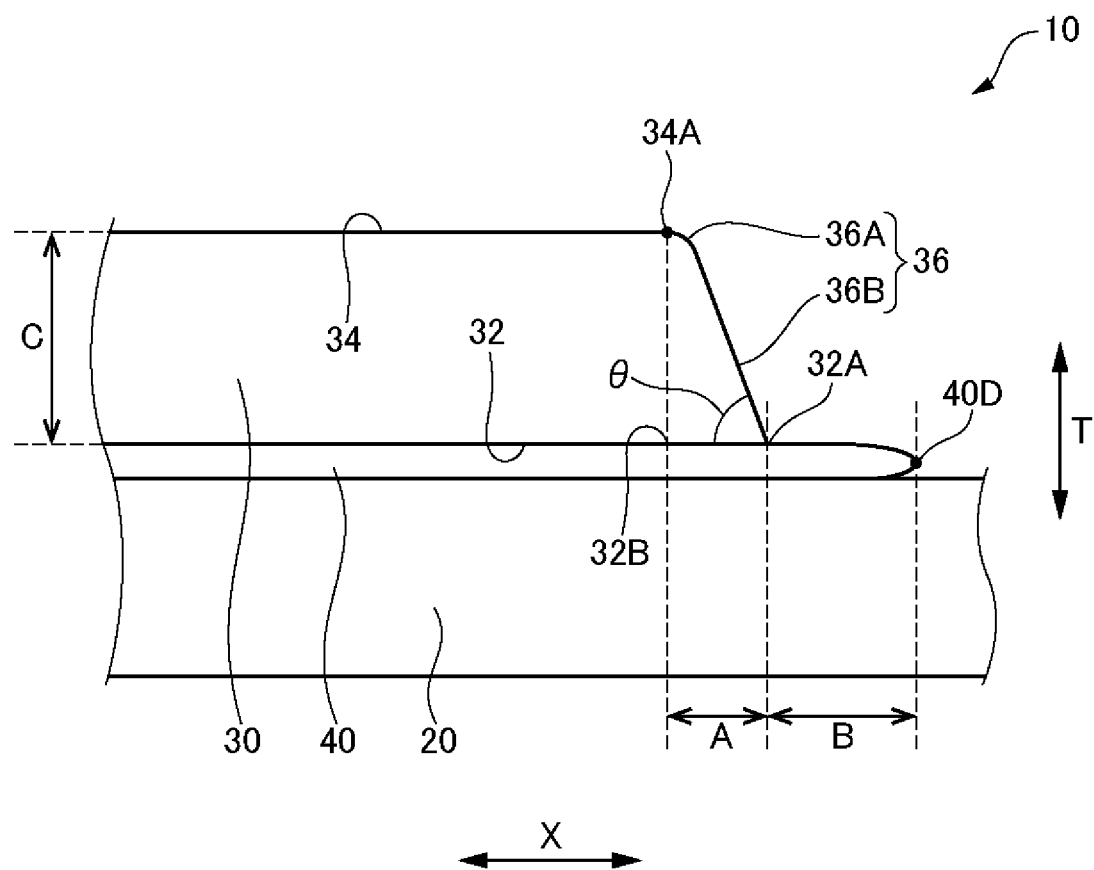
FIG. 2D is an enlarged cross-sectional view of the portion of the cross-sectional view of FIG. 2A in consideration of another example of the wettability of the brazing material.

The brazing material 40 has a cross-sectional shape as illustrated in FIGS. 2C and 2D, for example, in consideration of wettability. In a case where the brazing material 40 and the ceramic substrate 20 are in contact with each other while the thickness of the brazing material 40 decreases toward the outer edge, as illustrated in FIG. 2C, regarding a contact point 40C between the ceramic substrate 20 and the brazing material 40 in the cross section, a distance from the edge 32A of the lower surface 32 to the contact point 40C corresponds to the protrusion length B. As illustrated in FIG. 2D, in a case where the outer edge of the brazing material 40 has a convex shape, a length from the edge 32A of the lower surface 32 to an apex 40D of the convex portion is the protrusion length B.

The flat surface portion 36B is, for example, a region of the cross section, which has a linear line which is equal to or more than a predetermined length and roughness which is equal to or less than an average roughness of the surface. In other words, the region continuously has the inclination angle θ.

In the embodiment, as illustrated in FIG. 2A, the length A of a portion corresponding to the peripheral surface 36 in the X-direction (referred to as a peripheral surface length A) is 0.25 (mm) as an example. Considering the evaluation results of the examples described later (see the table in FIG. 4), the peripheral surface length A is preferably equal to or more than 0.15 (mm), and equal to or less than 0.30 (mm), as an example.

With the above description, in the bonded substrate 10 in the embodiment, a relation between the peripheral surface length A (mm) and the protrusion length B (mm) satisfies Expression 1 in consideration of the evaluation results of the examples described later (see the table in FIG. 4).

$$0.032 \leq B/(A+B) \leq 0.400 \qquad \text{(Expression 1)}$$

Considering the thickness C (mm) of the metal plate 30, the bonded substrate 10 in the embodiment satisfies Expression 2 while satisfying Expression 1.

$$0.5(\text{mm}) \leq C \leq 2.0(\text{mm}) \qquad \text{(Expression 2)}$$

As described above, the peripheral surface 36 of the bonded substrate 10 in the embodiment is configured by the curved surface portion 36A and the flat surface portion 36B. Here, as illustrated in FIG. 2B, in the cross-sectional view of the metal plate 30, when a linear line is drawn from the edge 32A to the inner side of the upper surface 34 of the metal plate 30 to obtain 45° with a linear line along the X-direction (for example, linear line corresponding to the lower surface 32), a point at which the drawn linear line intersects with the upper surface 34 is set as a point 34B. The area of a cross section corresponding to a right-angled isosceles triangle of which a hypotenuse is a linear line connecting the edge 32A and the point 34B is set as S1. The area of a cross section of a protrusion from the linear line connecting the edge 32A and the point 34B toward an outside of the ceramic substrate 20, that is, the area of a cross section obtained by excluding the above-described right-angled isosceles triangle from the end portion of the metal plate 30 is set as S2. In this case, in the embodiment, the relation between the area S1 and the area S2 satisfies Expression 3.

$$0.6 \leq S2/S1 \qquad \text{(Expression 3)}$$

As described above, the configuration of the bonded substrate 10 in the embodiment has been described with reference to the cross-sectional views (FIGS. 2A and 2B) of the bonded substrate, which is cut along the cutting line along the virtual line L1. The bonded substrate 10 in the embodiment has been described as satisfying Expressions 1 to 3 described above. Here, Expressions 1 and 3 among Expressions 1 to 3 are based on parameters defined using the cross-sectional view of the bonded substrate 10. Therefore, the values of Expressions 1 and 3 change depending on the direction of the cutting line.

However, in the case of the embodiment, as illustrated in FIG. 1, Expressions 1 and 3 are satisfied even in the case of the cross-sectional view of the bonded substrate, which is cut along a virtual line L2 parallel to a longitudinal direction (Y-direction) of the metal plate 30. Expressions 1 and 3 are satisfied even in the case of the cross-sectional view of the bonded substrate, which is cut along a virtual line L3 parallel to a lateral direction (Z-direction) of the metal plate 30. That is, in the case of the embodiment, not only the cross-sectional view of the bonded substrate, which is cut along the virtual line L1 along the diagonal line of the metal plate 30, but also cross-sectional views of the bonded substrate, which are cut along all virtual lines passing through the intersection O (see FIG. 1) of the two diagonal lines or the center O (when viewed from the Z-direction) satisfy Expressions 1 and 3. From another point of view, in the case of the embodiment, all cut surfaces of the bonded substrate, which are cut along all the diagonal lines along the Z-direction in the metal plate 30 satisfy Expressions 1 and 3.

The above description has been made for the configuration of the bonded substrate 10 in the embodiment.

<Metal Circuit Board>

The metal circuit board in the embodiment is a board in a state where a circuit pattern 60 is formed on the bonded substrate in FIGS. 1 and 2. The circuit pattern 60 is as described in the circuit board 50 below.

<Circuit Board>

Next, the circuit board 50 in the embodiment will be described with reference to FIGS. 3A and 3B. FIG. 3A is a top view of the circuit board 50 in the embodiment, and illustrates partially enlarged view of a mounted semiconductor element 70 and the surroundings. FIG. 3B illustrates a cross-sectional view of the circuit board 50 in FIG. 3A, which is cut along a cutting line 3B-3B.

As described above, the circuit board 50 in the embodiment refers to a board in a state where an electronic component such as a semiconductor element 70 is mounted on a portion of the circuit pattern 60 after the circuit pattern 60 is formed on the metal plate 30 of the bonded substrate 10. Here, as an example, the semiconductor element 70 is a so-called power IC, and the upper limit of a range for the operation temperature of the semiconductor element is 250° C. As illustrated in FIG. 3A, the circuit pattern 60 is a pattern formed by removing a portion of the metal plate 30 (specifically, etching as described later). The circuit pattern 60 is formed in consideration of a layout for a plurality of electronic components to be mounted. In the examples of FIGS. 3A and 3B, the semiconductor element 70 is bonded by solder 80 at a predetermined position of the circuit pattern 60.

The above description has been made for the configuration of the circuit board 50 in the embodiment.

<<Method of Manufacturing Circuit Board and Metal Circuit Board in Embodiment>>

Next, a method of manufacturing the circuit board 50 (see FIGS. 3A and 3B) and the metal circuit board in the embodiment will be described.

Firstly, the brazing material 40 is applied onto one surface of the ceramic substrate 20.

Then, the metal plate 30 is attached to one surface of the ceramic substrate 20, which is coated with the brazing material 40. That is, the metal plate 30 is bonded to the ceramic substrate 20.

Then, the metal plate 30 is etched so that the metal plate 30 becomes rectangular inside the ceramic substrate 20 when viewed from the upper side in the T direction as illustrated in FIG. 1, for example.

Then, predetermined surface treatment is performed on the upper surface 34 of the metal plate 30.

As described above, the bonded substrate 10 required for manufacturing the circuit board 50 is manufactured. When the etching of the metal plate 30 is completed, the brazing material 40 is in a state of protruding from the entire peripheral edge of the metal plate 30. The peripheral surface 36 of the metal plate 30 becomes a surface including an inclined surface as illustrated in FIGS. 2A and 2B due to the influence of etching.

Then, a photoresist (not shown) is laminated on the upper surface 34 of the metal plate 30 of the bonded substrate 10. In this case, a liquid photoresist may be applied.

Then, in order to form the circuit pattern 60 on the photoresist, the pattern according to the circuit pattern 60 is exposed. In this case, the photoresist may be exposed by so-called batch exposure in which a film on which a negative image of the circuit pattern 60 is formed is brought into close contact with the photoresist, or the photoresist may be exposed using so-called a direct drawing type exposure device (without using the above film).

Then, the exposed photoresist is etched in accordance with the circuit pattern 60.

Then, the remaining photoresist is removed.

With the above description, the bonded substrate 10 (that is, metal circuit board) in a state where the circuit pattern 60 is formed is manufactured.

Then, when an electronic component such as the semiconductor element 70 is mounted on the bonded substrate 10 (that is, metal circuit board) in the state where the circuit pattern 60 is formed, the circuit board 50 is completed as illustrated in FIGS. 3A and 3B.

The above description has been made for the method of manufacturing the circuit board 50 in the embodiment.

<<Heat Cycle Test of Examples and Comparative Examples>>

A plurality of bonded substrates (Samples 1 to 27) were prepared with the peripheral surface length A (mm), the protrusion length B (mm), the thickness C (mm) of the metal plate 30, the inclination angle θ (°), and S2/S1, as the parameters. Then, a heat cycle test described later was performed. In this case, the setting conditions were the same as those of the above-described bonded substrate 10 in the embodiment except for the above parameters (see FIGS. 1, 2A, and 3B).

Then, a case of satisfying predetermined criteria described later and a case of not satisfying the predetermined criteria were examined. As a result, as shown in the table of FIG. 4, the cases of satisfying Expressions 1 to 3 described above are the cases of satisfying the predetermined criteria.

Details of the heat cycle test will be described below.

Firstly, a bonded substrate to be tested at room temperature (20° C. as an example) is moved to an environment of 150° C., and is held for 15 minutes in the environment of 150° C. (first process).

Then, the bonded substrate is moved from the environment of 150° C. to an environment of −55° C., and is held for 15 minutes in the environment of −55° C. (second process).

Then, the first process and the second process are alternately repeated 2000 times.

Then, ultrasonic flaw detection measurement is performed to observe whether or not the metal plate 30 is peeled off.

As a result, the inventor of the present application determined that the bonded substrate observed to have peeling did not satisfy the predetermined criteria, and that the bonded substrate observed to have no peeling satisfied the predetermined criteria. In the "evaluation result" in the table of FIG. 4, the "case of satisfying the predetermined criteria" was described as OK, and the "case of not satisfying the predetermined criteria" was described as NG.

In the table in FIG. 4, Samples 1 to 11 and 13 to 21 correspond to Examples 1 to 20 based on the above evaluation results, respectively. Sample 12 corresponds to the bonded substrate 10 in the embodiment. Samples 22 to 28 correspond to Comparative Examples 1 to 7, respectively.

From the above description, the table in FIG. 4 shows the results of the heat cycle test. The inventor of the present application found that the bonded substrates (Samples 1 to 21) satisfying Expressions 1 to 3 were excellent in heat cycle characteristics in comparison to the bonded substrates (Samples 22 to 28) that did not satisfy Expressions 1 to 3.

The above description has been made for the heat cycle test performed on the plurality of examples and the plurality of comparative examples.

<<Effect of Embodiment>>

As described above, it was found that the bonded substrate 10 and the metal circuit board in the embodiment and the example, which satisfy Expressions 1 to 3, were excellent in heat cycle characteristics in comparison to the bonded substrates which did not satisfy at least any one of Expressions 1 to 3. Here, the bonded substrate that does not satisfy at least any one of Expressions 1 to 3 includes, for example, the bonded substrates disclosed in Patent Documents 1 and 2 described above and bonded substrates modified in the scope of Patent Documents 1 and 2.

Therefore, even in a case where the metal plate 30 has a large thickness C (for example, being equal to or more than 0.5 (mm) and equal to or less than 2.0 (mm)), the bonded substrate 10 and the metal circuit board in the embodiment and the example in the embodiment has excellent heat cycle characteristics while securing a mounting region for electronic components. Along with this, even in a case where the metal plate 30 (portion of the circuit pattern 60) has a large thickness C, the circuit board 50 in the embodiment has excellent heat cycle characteristics while securing a mounting region for electronic components. Therefore, the circuit board 50 in the embodiment has a problem less frequently even in a case where an electronic component (for example, power IC) in which the upper limit of a range of an operation temperature is high, for example, 250° C. is mounted.

The effect of the embodiment, in other words, the technical superiority of the bonded substrate 10 and the metal circuit board in the embodiment and the example, that satisfied Expressions 1 to 3, was found based on the results obtained in a manner the inventor of the present application performed the above-described heat cycle test. The technical superiority is characteristics for heat, and thus qualitative. Therefore, the inventor of the present application confirms that results similar to those in a case of the above-described heat cycle test were found by a heat cycle test of conditions different from one or all of conditions on the holding temperature, the holding time, and the number of repetitions (2000 times) in the first and second processes, in this heat cycle test. That is, the technical superiority of the bonded substrate 10 and the metal circuit board satisfying Expressions 1, 2 and 3 can also be obtained from the heat cycle test under conditions different from those of the present heat cycle test (for example, the condition that the number of repetitions is less than 2000).

Modification Example

As described above, the present invention has been described with the above-described embodiments and examples, as an example, but the present invention is not limited to the above-described embodiments and examples. The technical scope of the present invention also includes, for example, the following forms (modification examples).

For example, in the description of the embodiment, it is assumed that Expressions 1 to 3 are satisfied in the cross-sectional view of the entire peripheral edge of the metal plate 30. However, considering the above-described results of the heat cycle test, the following description will be made. That is, in at least one of the plurality of cut surfaces obtained by cutting the bonded substrate along the stacking direction (preferably five or more among any ten cross sections), the structure of the peripheral edge of the metal plate 30 may satisfy Expressions 1 to 3 (as described later, since Expression 3 is not essential, Expressions 1 and 2 may be satisfied in at least one cut surface (preferably, five or more among any ten cross sections)). From another point of view, a bonded substrate or a metal circuit board (not illustrated) in which any one of Expressions 1 to 3 is not satisfied in a portion of the entire peripheral edge, but all Expressions are satisfied in the remaining portions has excellent heat cycle characteristics while securing a mounting region for electronic components, in comparison to the above-described bonded substrates in the comparative examples. That is, the technical scope of the present invention also includes a bonded substrate and a metal circuit board in which any one of Expressions 1 to 3 is not satisfied in the portion of the entire peripheral edge, but all Expressions are satisfied in the remaining portions. Here, Expression 2 corresponds to the thickness C of the metal plate 30, and usually has a constant value. Therefore, satisfying Expression 2 is not changed depending on the cross section (in a case where the thickness C is not constant, the average of the maximum value and the minimum value of the thickness C in the cross-sectional view is set as the thickness C). Therefore, in a case where all Expressions 1 to 3 are not satisfied depending on the cross section, a cross section that does not satisfy Expression 1, a cross section that does not satisfy Expression 3, or a cross section that does not satisfy both Expressions 1 and 3 may be usually provided (since Expression 3 is not essential, a case of not satisfying both Expressions 1 and 2 depending on the cross section is a case of not satisfying Expression 1 depending on the cross section).

In the description of the embodiment, an example of satisfying Expressions 1 to 3 has been described, but, in the present invention, it is important to satisfy Expression 1 in a case where the metal plate 30 is thick (in the case of Expression 2). Therefore, Expression 3 may not be satisfied.

Figure 5:
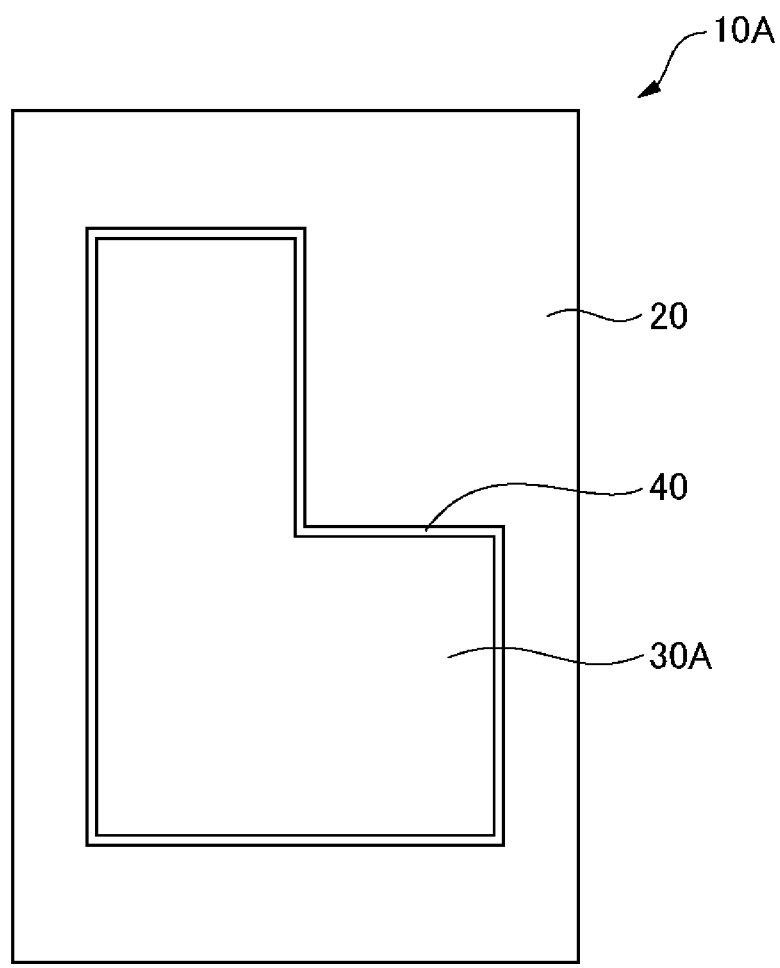
FIG. 5 is a top view of a bonded substrate according to a modification example.

In the embodiment, the description has been made on the assumption that the shape of the metal plate 30 when viewed from the T direction is rectangular (see FIG. 1). However, the shape of the metal plate 30 when viewed from the T direction may not be rectangular as long as the bonded substrate satisfies Expressions 1 to 3. The shape of the metal plate 30 when viewed from the T direction may be an elliptical shape without corners, a triangle shape, a polygonal shape having four or more corners (for example, bonded substrate 10A in the modification example of FIG. 5), a composite shape obtained by combining an ellipse and a rectangle, and other two-dimensional shapes.

Figure 6:
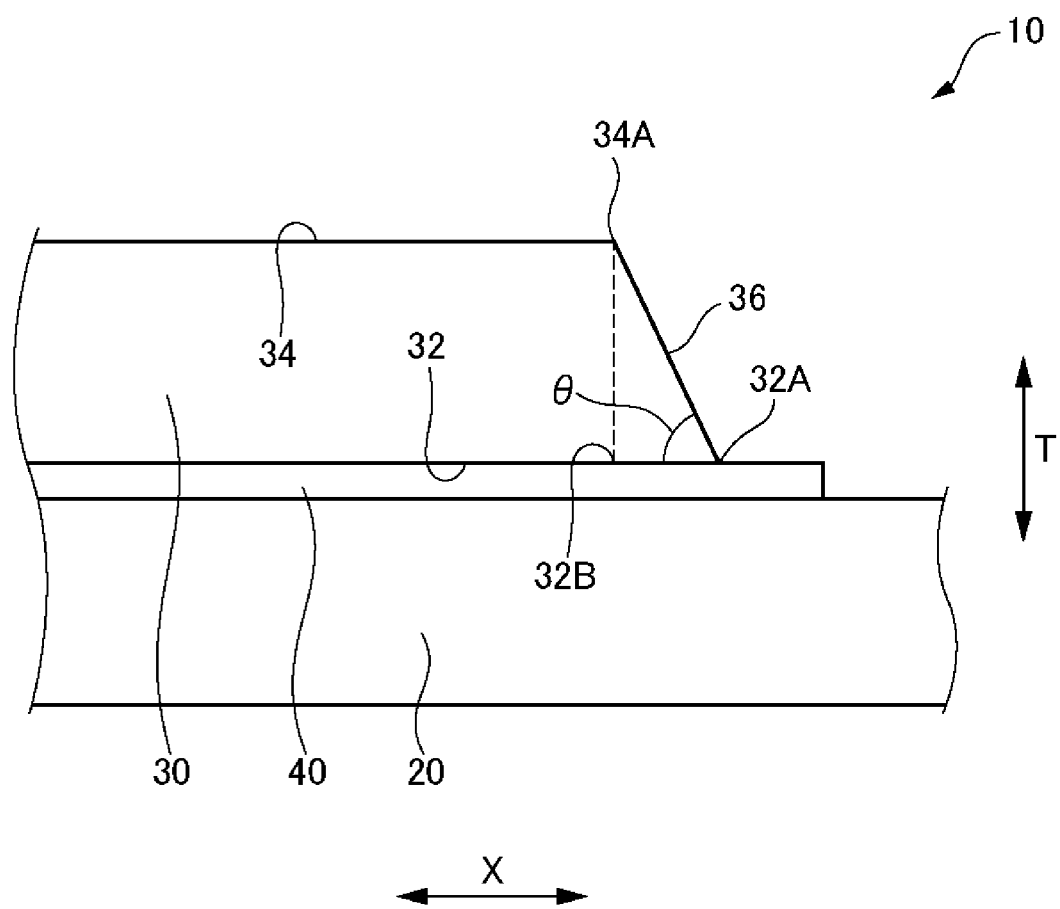
FIG. 6 is a partial cross-sectional view of a bonded substrate according to another modification example.

In the embodiment, the description has been made on the assumption that the peripheral surface 36 of the metal plate 30 is configured by the curved surface portion 36A and the flat surface portion 36B. However, the peripheral surface 36 may not be configured by the curved surface portion 36A and the flat surface portion 36B as long as the bonded substrate satisfies Expressions 1 to 3. For example, as in the bonded substrate 10B in the modification example illustrated in FIG. 6, the portion of the peripheral surface 36 in the cross-sectional view may be a linear line segment (side surface is flat). The peripheral surface 36 in the cross-sectional view may be a curved line (not illustrated). In a case where the peripheral surface 36 is not flat but curved, the inclination angle θ means an angle formed by the tangent line of the peripheral surface 36 at the edge 32A and the lower surface 32 in the cross-sectional view.

This application claims priority on the basis of Japanese application Japanese Patent Application No. 2018-181383 filed on Sep. 27, 2018, and incorporates all of its disclosures herein.

The invention claimed is:

1. A bonded substrate comprising:
a substrate;
a metal plate that forms a stacked state along with the substrate, has a first surface on the substrate side and a second surface on an opposite side of the first surface, and has an edge of the first surface, which is located outside an edge of the second surface when viewed in a stacking direction; and
a bonding member that is disposed between the substrate and the metal plate, so as to bond the metal plate to the substrate, and protrudes from the edge over an entire periphery of the metal plate when viewed from the stacking direction,
wherein for at least one of a plurality of cut surfaces obtained by cutting the bonded substrate along the stacking direction, a length from a portion corresponding to a peripheral edge of the first surface to a portion corresponding to a peripheral edge of the second surface in an orthogonal direction orthogonal to the stacking direction is a peripheral surface length A in millimeters, a length of a protruding portion of the bonding member in the orthogonal direction is a protrusion length B in millimeters, and a distance from the first surface to the second surface is a thickness C in millimeters of the metal plate, $$0.032 \leq B/(A+B) \leq 0.400,$$

$$0.5 \leq C \leq 2.0,$$

a peripheral surface of the metal plate that connects an entire peripheral edge of the first surface and an entire peripheral edge of the second surface includes an inclined surface,
in the at least one of the plurality of cut surfaces, an inclination angle in degrees of the inclined surface with respect to the orthogonal direction is θ,

θ>69, an area of a cross section that is a right-angled isosceles triangle where the hypotenuse is a straight line from the portion corresponding to the peripheral edge of the first surface to inside of an upper surface of the metal plate and a leg is coincident with the first surface is S1, an area of the cross section that is from the hypotenuse to outside of the substrate is S2, and $$0.6 \leq S2/S1.$$

2. The bonded substrate according to claim 1, wherein the metal plate is a polygon having four or more corners when viewed from the stacking direction, and the at least one of the plurality of cut surfaces is along a diagonal line of the metal plate when viewed from the stacking direction.

3. The bonded substrate according to claim 2, wherein in all cut surfaces obtained by cutting the bonded substrate along all diagonal lines along the stacking direction, the peripheral surface length A and the protrusion length B satisfy $0.032 \leq B/(A+B) \leq 0.400$.

4. The bonded substrate according to claim 1, wherein in all cut surfaces obtained by cutting the bonded substrate along all diagonal lines along the stacking direction, the inclination angle θ satisfies θ>69.

5. The bonded substrate according to claim 1, wherein the peripheral surface length A in a range equal to or more than 0.15 and equal to or less than 0.30.

6. A metal circuit board in which a circuit pattern is formed on the metal plate of the bonded substrate according to claim 1.

7. A circuit board comprising:
the bonded substrate according to claim 1; and
an electronic component mounted on the metal plate on which a circuit pattern is formed.

8. The circuit board according to claim 7, wherein an operation temperature of the electronic component is equal to or higher than 100° C. and equal to or lower than 250° C.

* * * * *